(12) United States Patent
Le et al.

(10) Patent No.: US 8,289,697 B2
(45) Date of Patent: Oct. 16, 2012

(54) EQUIPMENT RACKS UTILIZING RAIL ENGAGING RETAINING BRACKETS THAT LIMIT CHASSIS MOVEMENT

(75) Inventors: Long Larry Le, Morrisville, NC (US); Bright Huang, Jiangxi Province (CN)

(73) Assignee: Eaton Corporation, Cleveland, OH (US)

( * ) Notice: Subject to any disclaimer, the term of this patent is extended or adjusted under 35 U.S.C. 154(b) by 233 days.

(21) Appl. No.: 12/873,561

(22) Filed: Sep. 1, 2010

(65) Prior Publication Data
US 2011/0058339 A1   Mar. 10, 2011

Related U.S. Application Data

(60) Provisional application No. 61/239,827, filed on Sep. 4, 2009.

(51) Int. Cl.
*G06F 1/16* (2006.01)

(52) U.S. Cl. ............... 361/679.4; 312/408; 248/430; 455/575.1

(58) Field of Classification Search ............... 312/223.1, 312/223.2, 334.8, 408, 330.1, 334.4; 248/309.1, 248/206.5, 51, 429, 430; 455/575.1, 90.1; 361/679.33, 679.46, 679.4, 679.58, 679.02, 361/679.32, 679.47, 679.53, 679.54, 688, 361/701, 737
See application file for complete search history.

(56) References Cited

U.S. PATENT DOCUMENTS

| | | | |
|---|---|---|---|
| 6,259,605 B1 * | 7/2001 | Schmitt | 361/727 |
| 2004/0233643 A1 * | 11/2004 | Bolich et al. | 361/727 |
| 2009/0262501 A1 * | 10/2009 | Claassen et al. | 361/701 |

* cited by examiner

*Primary Examiner* — Hung Duong
(74) *Attorney, Agent, or Firm* — Myers Bigel Sibley & Sajovec, P.A.

(57) ABSTRACT

An apparatus includes an equipment chassis configured to house electronic circuitry and to be inserted in an equipment rack between an opposed pair of rails. The equipment chassis includes a bottom face configured to rest on shelf members of the rails. The apparatus further includes a retaining bracket disposed at a side face of the equipment chassis facing one of the rails and oriented substantially perpendicular to the bottom face of the equipment chassis. The retaining bracket is configured to engage a horizontal groove in the one of the rails when the equipment chassis is inserted horizontally into the equipment rack between the rails. The retaining bracket may be configured to engage the one of the rails to limit vertical movement of the equipment chassis.

20 Claims, 4 Drawing Sheets

EQUIPMENT RACKS UTILIZING RAIL ENGAGING RETAINING BRACKETS THAT LIMIT CHASSIS MOVEMENT

RELATED APPLICATION

The present application claims priority from U.S. Provisional Application Ser. No. 61/239,827, entitled Equipment Racks Utilizing Rail Engaging Retaining Brackets That Limit Chassis Movement, filed Sep. 4, 2009 and incorporated herein by reference in its entirety.

BACKGROUND

The inventive subject matter relates to equipment racks, rack mount hardware, and methods of mounting equipment therein.

Racks with provision to mount electronic chassis are commonly used in telecommunications and computer networking applications. A typical data center, for example, may include multiple racks in which equipment chassis, e.g., servers, storage units, power supplies and the like, are inserted and mounted. Such racks commonly include rails that are mounted in horizontally opposed pairs in the rack and provide shelves or ledges that support an inserted equipment chassis. The equipment chassis may be secured in the rack by fastening a front flange thereof to a mating surface of the rack or rails.

Conventional rack mounting arrangements may not provide adequate constraint of movement of the equipment chassis mounted therein. Therefore, significant movement of the equipment chassis may occur when, for example, the rack is being transported or subjected to vibration testing. Conventional techniques for constraining such movement may involve the use of specialized retaining hardware that affixes the rear end of an equipment chassis using loose hardware components that often must be removed when the rack is prepared for use, so that the chassis is freed to slide on the rack rails.

SUMMARY

Some embodiments of the inventive subject matter provide an apparatus including an equipment chassis configured to house electronic circuitry and to be inserted in an equipment rack between an opposed pair of rails. The equipment chassis includes a bottom face configured to rest on shelf members of the rails. The apparatus further includes a retaining bracket disposed at a side face of the equipment chassis facing one of the rails and oriented substantially perpendicular to the bottom face of the equipment chassis. The retaining bracket is configured to engage a horizontal groove in the one of the rails when the equipment chassis is inserted horizontally into the equipment rack between the rails. The retaining bracket may be configured to engage the one of the rails to limit vertical movement of the equipment chassis. Such retaining brackets may be provided on opposites side faces of the equipment chassis such that they engage grooves of respective ones of the opposed rails.

In some embodiments, the retaining bracket is fastened to the side face of the equipment chassis. In further embodiments, the retaining bracket may be integrated in a housing of the equipment chassis.

In some embodiments, the retaining bracket includes a planar member conforming to the side face of the equipment chassis and a flange extending perpendicularly from the planar member and configured to engage the groove. An upper surface of the flange may face an upper interior wall of the groove when the equipment chassis is inserted horizontally into the equipment rack between the rails. An end of the flange may be bent such that the end is deflected away from the upper interior wall of the groove when the flange is deployed in the groove.

In further embodiments, the retaining bracket may be disposed proximate a rear of the equipment chassis such that it is positioned proximate a first end of the one of the rails when a front mounting flange of the equipment chassis is attached to a mounting flange of the one of the rails proximate a second end thereof. The one of the rails may include a flange positioned in the groove proximate the first end of the one of the rails and configured to engage an upper surface of the flange of the retaining bracket to further limit movement thereof in the groove when the equipment chassis is fully inserted into the equipment rack.

Further embodiments of the inventive subject matter provide an apparatus for constraining movement of an equipment chassis mounted in an equipment rack between an opposed pair of rails, the equipment chassis including a bottom face configured to rest on shelf members of the rails. The apparatus includes a retaining bracket configured to be fastened at a side face of the equipment chassis facing one of the rails and oriented substantially perpendicular to the bottom face of the equipment chassis. The retaining bracket is configured to engage a horizontal groove in the one of the rails when the equipment chassis is inserted horizontally into the equipment rack between the rails. The retaining bracket may be configured to limit vertical movement of the equipment chassis.

In some embodiments, retaining bracket includes a planar mounting member configured to conform to the side face of the equipment chassis and to be fastened thereto and a flange extending perpendicularly from the mounting member and configured to engage the groove. An upper surface of the flange may face an upper interior wall of the groove when the equipment chassis is inserted horizontally into the equipment rack between the rails. An end of the flange may be bent such that the end is deflected away from the upper interior wall of the groove when the flange is deployed in the groove.

In further embodiments, an apparatus includes an equipment rack including an opposed pair of rails mounted horizontally therein and an equipment chassis housing electronic circuitry and positioned between the opposed pair of rails. The equipment chassis includes a bottom face resting on shelf members of the rails. The apparatus further includes a retaining bracket disposed at a side face of the equipment chassis facing one of the rails and oriented substantially perpendicular to the bottom face of the equipment chassis, the retaining bracket engaging a horizontal groove in the one of the rails to limit vertical movement of the equipment chassis. The retaining bracket may be fastened to the side face of the equipment chassis or integrated in a housing thereof.

The retaining bracket may include a planar member conforming to the side face of the equipment chassis and a flange extending perpendicularly from the planar member and configured to engage the groove. An upper surface of the flange may face an upper interior wall of the groove. An end of the flange may be bent such that the end is deflected away from the upper interior wall of the groove. The retaining bracket may be disposed proximate a rear of the equipment chassis such that it is positioned proximate a first end of the one of the rails and a front mounting flange of the equipment chassis may be configured to be attached to a mounting flange of the one of the rails proximate a second end thereof. The one of the rails may include a flange positioned in the groove proximate the first end of the one of the rails and configured to engage an upper surface of the flange of the retaining bracket to further limit movement thereof in the groove when the equipment chassis is fully inserted into the equipment rack.

DETAILED DESCRIPTION

Figure 1:
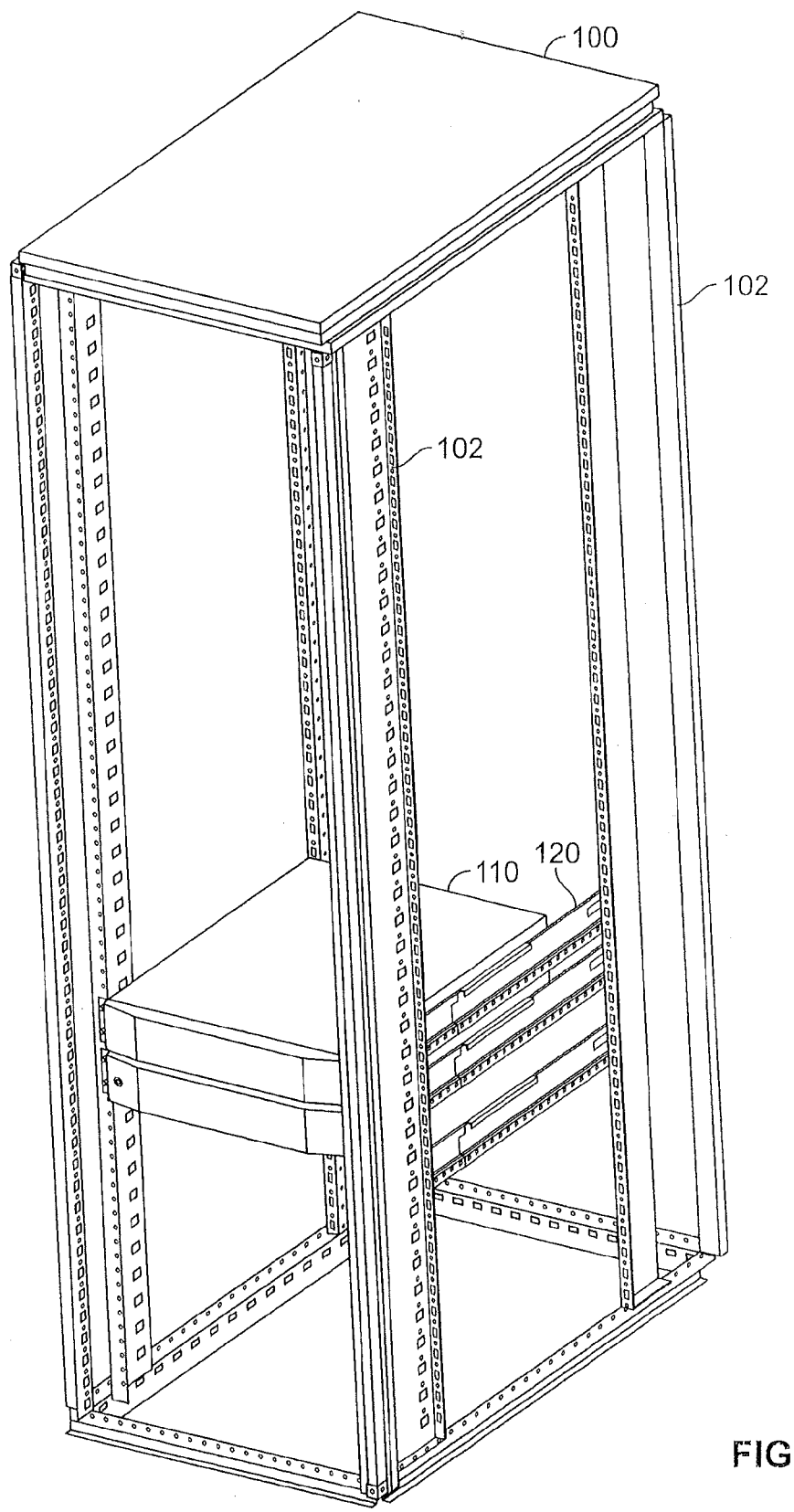
FIG. 1 is a perspective view of an equipment rack with equipment chassis installed therein according to some embodiments of the inventive subject matter.

The inventive subject matter now will be described more fully hereinafter with reference to the accompanying drawings, in which illustrative embodiments of the inventive subject matter are shown. In the drawings, the relative sizes of regions or features may be exaggerated for clarity. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a rack 100 having one or more equipment chassis 110 that house electronic circuitry mounted therein. As shown, an equipment chassis 110 is supported by rails 120 that are mounted to vertical posts 102 of the equipment rack 100.

Figure 2:
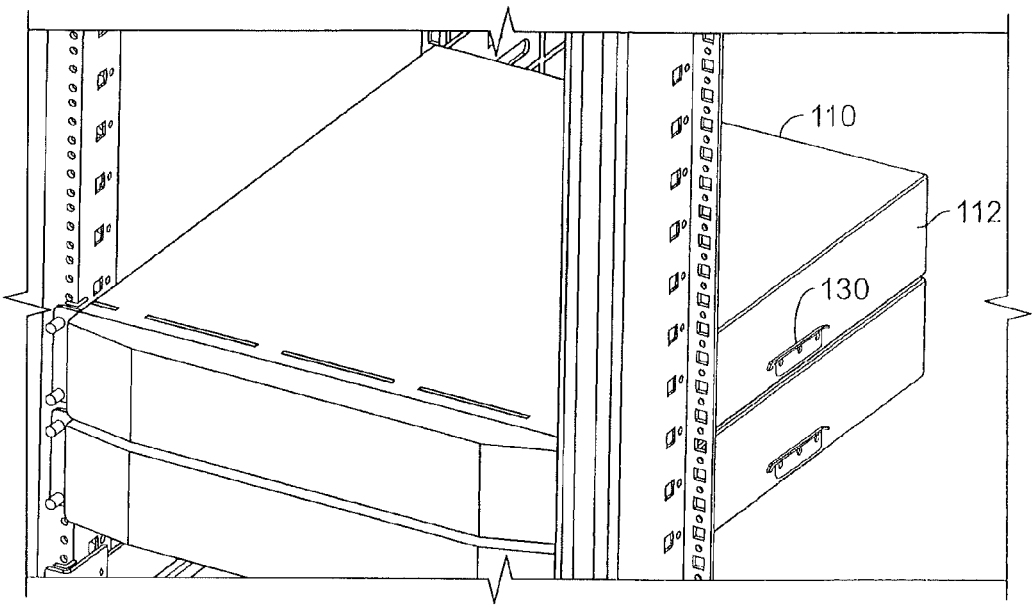
FIG. 2 is a close-up cutaway perspective view of the equipment rack of FIG. 1.
Figure 3:
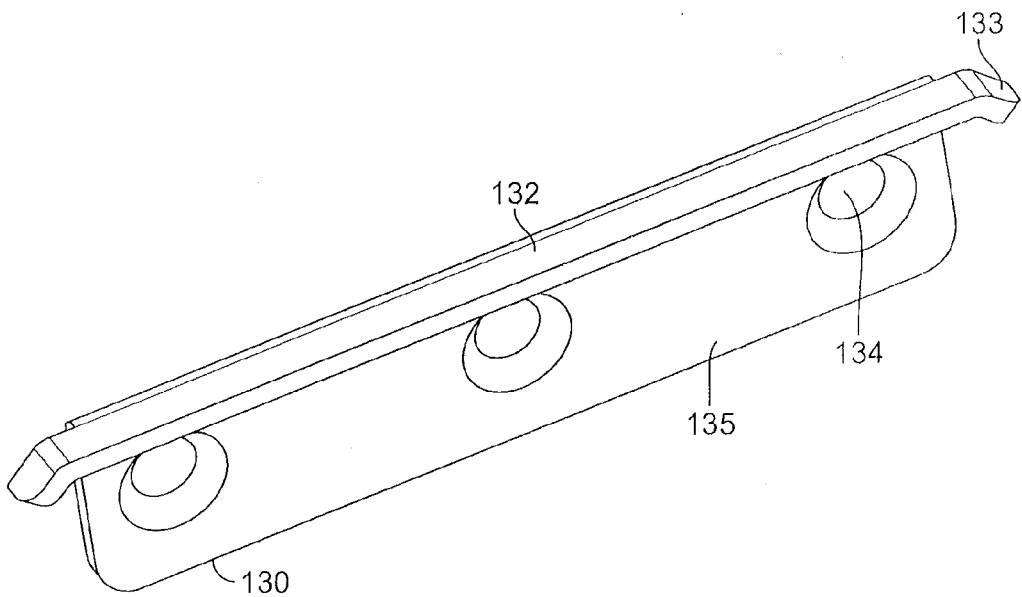
FIG. 3 is a perspective view of a retaining bracket for the equipment chassis of FIGS. 1 and 2.

FIG. 2 illustrates the equipment chassis 110 in greater detail, with the rails 120 removed for purposes of illustration. Retaining brackets 130 are affixed to side faces 112 of the equipment chassis 110. As shown in FIG. 3, the retaining bracket 130 includes a flange 132 extending perpendicularly from a mounting member 135. The flange 132 is bent at ends 133. The mounting member 135 has holes 134 therein configured to accept screws or bolts for affixing the retaining bracket 130 to the equipment chassis 110. Although the retaining bracket 130 is shown as a discrete piece, it will be appreciated that, in some embodiments, the bracket 130 may formed integrally with the equipment chassis 110, e.g., the flange 132 and other features of the bracket 130 may be incorporated in a housing of the chassis 110. It will be appreciated that a single retaining bracket 130 may be used, or retaining brackets 130 may be used on respective opposite side surfaces 112 of the equipment chassis 110 to engage rails 120 on each side.

Figure 4:
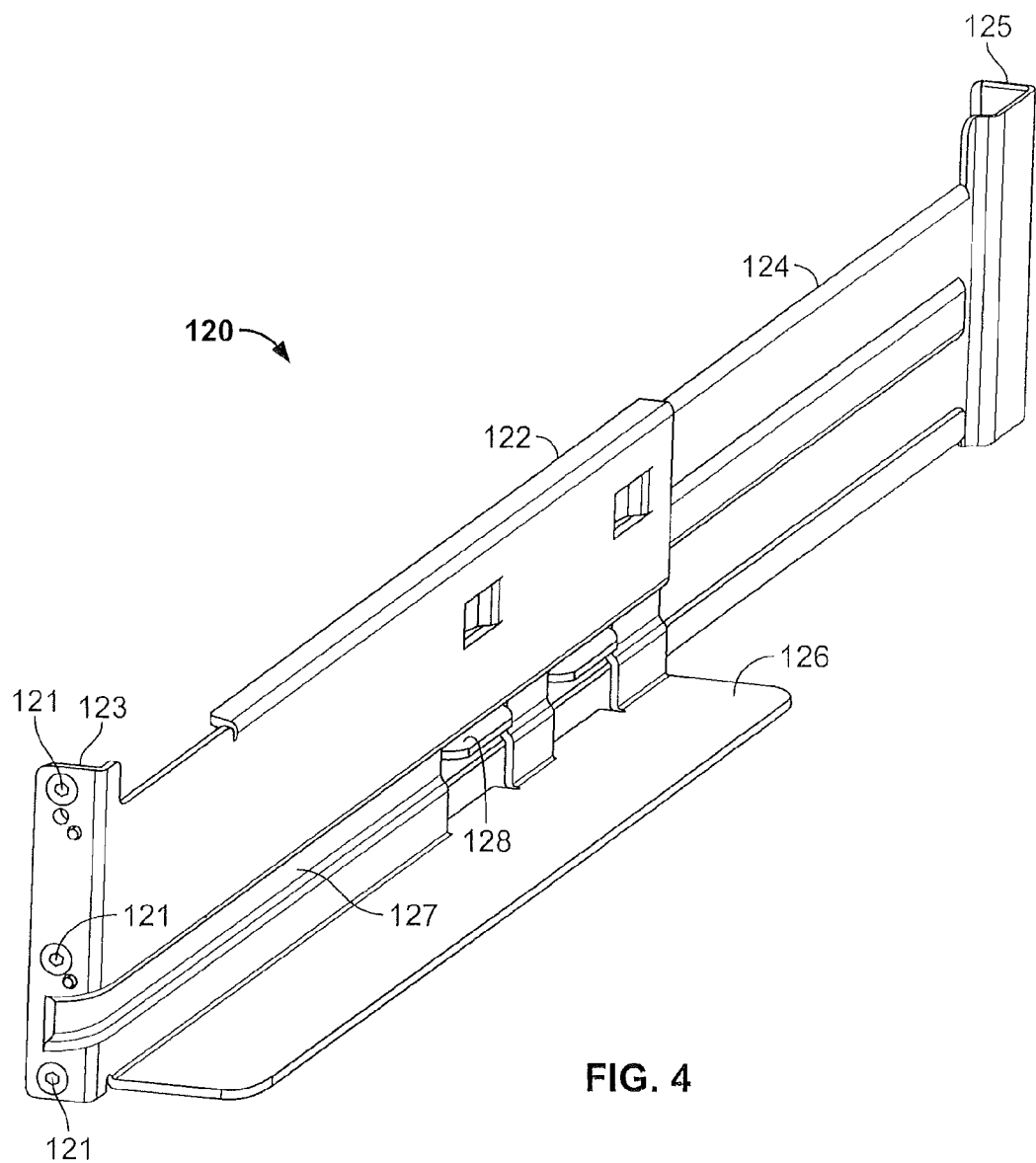
FIG. 4 is a perspective view of a rail of the equipment chassis of FIG. 1.

FIG. 4 illustrates features of a rail 120. The rail 120 may include front and rear portions 122, 124 that slidably engage to allow telescoping adjustment of the length of the rail 120. The front and rear rail portions 122, 124 include front and rear flanges 123, 125 that are configured to support attachment of the rail 120 to the vertical posts 102 of the rack 100 using, for example, a clamping mechanism 120 or other means for attachment, such as screws or bolts. The front flange 123 further includes holes 121 configured to accept screws or bolts for attaching a mating front flange of the equipment chassis 110 when the chassis 110 is inserted in the rack 110 along the rail 120. The front rail portion 122 also includes a shelf member 126 that is configured to support a bottom face of an equipment chassis 110 when the chassis 110 is inserted in the rack 110 along the rail 120.

Figure 5:
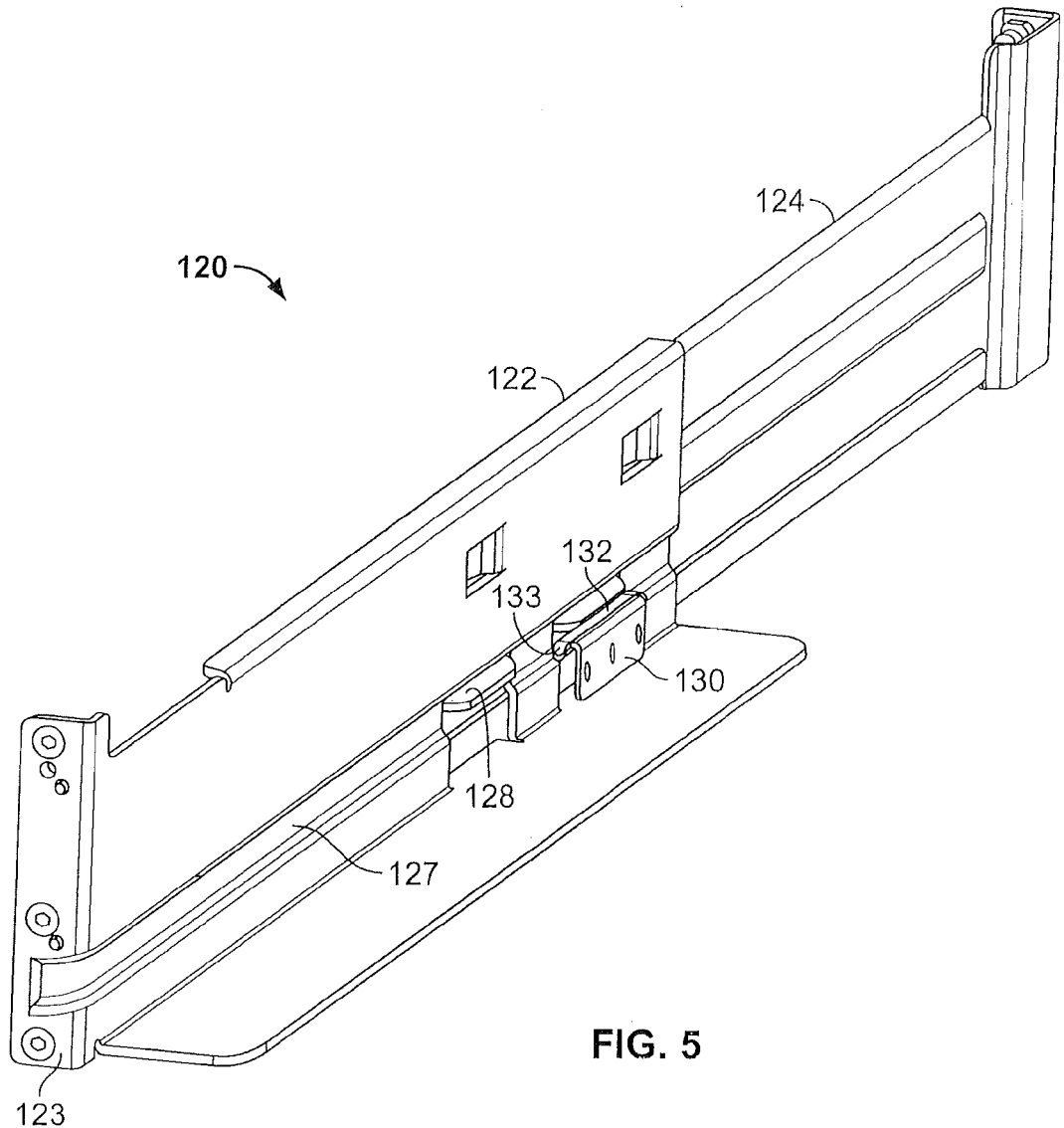
FIG. 5 is a perspective view of the rail of FIG. 4 illustrating engagement of the retaining bracket of FIG. 3.

As further illustrated in FIGS. 4 and 5, the front portion 122 of the rail 120 has a groove 127 formed therein. The groove 127 is configured to engage the retaining bracket 130 illustrated in FIGS. 2 and 3. In the illustrated embodiments, the groove 127 extends from a point proximate the front flange 123 to a point proximate an end of the front rail portion 122, such that an equipment chassis 110 having the bracket 130 affixed to a side face thereof may slide along the rail 120 with the flange 132 of the bracket 130 engaging the groove 127. The bends 133 in the flange 132 deflect ends of the flange 132 away from an upper inner sidewall of the groove 120, which may reduce binding as the bracket 130 moves along the groove 127 and may ease alignment of the bracket 130 with the groove 127 when inserting the chassis 110. As further shown, the front portion 122 of the rail 120 may further include flanges 128 that are configured to engage the flange 132 of the bracket 130 to provide enhanced constraint on vertical movement of an equipment chassis 110 with respect to the shelf member 126 of the rail 120 when fully inserted along the rail 120. As shown, the flanges 128 may be formed by cutting and bending out sheet metal that forms the front rail portion 122, but it will be appreciated that the flanges 128 may take other forms, such as mating brackets configured to be affixed to the rail 120. As shown, multiple flanges 128 may be provided at different positions along the rail 120 to accommodate equipment chassis 110 of different depths.

There are several potential advantages offered by embodiments of the present inventive subject matter. Conventional rack mounting arrangements that do not include a rail retaining bracket as shown herein may not provide adequate constraint of movement of the rear portion of the equipment chassis when mounted in the rack. Thus, significant movement of the equipment chassis may occur in such arrangements when, for example, the rack is being transported or subjected to vibration testing. Conventional techniques for constraining such movement may involve the use of specialized retaining hardware that affix to the rear end of an equipment chassis using loose hardware components that often must be removed when the rack is prepared for use so as to allow the chassis to slide along the rails of the equipment rack. In contrast, retaining brackets as shown herein may be left in place after installation, as they can provide a vertical movement constraint without affixing the equipment chassis to a rack or rail. The retaining brackets may also be symmetrical, allowing the same part to be used for right and left sides of the chassis. The mounting of the brackets may also be adjustable to accommodate variations in mounting tolerances.

The foregoing is illustrative of the inventive subject matter and is not to be construed as limiting thereof. Although a few exemplary embodiments of this inventive subject matter have been described, those skilled in the art will readily appreciate that many modifications are possible in the exemplary embodiments without materially departing from the novel teachings and advantages of this inventive subject matter. Accordingly, all such modifications are intended to be included within the scope of this inventive subject matter. Therefore, it is to be understood that the foregoing is illustrative of the inventive subject matter and is not to be construed as limited to the specific embodiments disclosed, and that modifications to the disclosed embodiments, as well as other embodiments, are intended to be included within the scope of the inventive subject matter.

That which is claimed is:

1. An apparatus, comprising:
   an equipment chassis configured to house electronic circuitry and to be inserted in an equipment rack between an opposed pair of rails, the equipment chassis comprising a bottom face configured to rest on shelf members of the rails; and
   a retaining bracket disposed at a side face of the equipment chassis facing one of the rails and oriented substantially perpendicular to the bottom face of the equipment chassis, the retaining bracket configured to engage a horizontal groove in the one of the rails when the equipment chassis is inserted horizontally into the equipment rack between the rails.

2. The apparatus of claim 1, wherein the retaining bracket is configured to limit vertical movement of the equipment chassis.

3. The apparatus of claim 1, wherein the retaining bracket is fastened to the side face of the equipment chassis.

4. The apparatus of claim 1, wherein the retaining bracket comprises:
   a planar member conforming to the side face of the equipment chassis; and
   a flange extending perpendicularly from the planar member and configured to engage the groove.

5. The apparatus of claim 4, wherein an upper surface of the flange faces an upper interior wall of the groove when the equipment chassis is inserted horizontally into the equipment rack between the rails.

6. The apparatus of claim 5, wherein an end of the flange is bent such that the end is deflected away from the upper interior wall of the groove when the flange is deployed in the groove.

7. The apparatus of claim 4, wherein the retaining bracket is disposed proximate a rear of the equipment chassis such that it is positioned proximate a first end of the one of the rails when a front mounting flange of the equipment chassis is attached to a mounting flange of the one of the rails proximate a second end thereof.

8. The apparatus of claim 7, wherein the one of the rails comprises a flange positioned in the groove proximate the first end of the one of the rails and configured to engage an upper surface of the flange of the retaining bracket to further limit movement thereof in the groove when the equipment chassis is fully inserted into the equipment rack.

9. An apparatus for constraining movement of an equipment chassis mounted in an equipment rack between an opposed pair of rails, the equipment chassis comprising a bottom face configured to rest on shelf members of the rails, the apparatus comprising:
   a retaining bracket configured to be fastened at a side face of the equipment chassis facing one of the rails and oriented substantially perpendicular to the bottom face of the equipment chassis, the retaining bracket configured to engage a horizontal groove in the one of the rails when the equipment chassis is inserted horizontally into the equipment rack between the rails.

10. The apparatus of claim 9, wherein the retaining bracket is configured to limit vertical movement of the equipment chassis.

11. The apparatus of claim 9, wherein the retaining bracket comprises:
    a planar mounting member configured to conform to the side face of the equipment chassis and to be fastened thereto; and
    a flange extending perpendicularly from the mounting member and configured to engage the groove.

12. The apparatus of claim 11, wherein an upper surface of the flange faces an upper interior wall of the groove when the equipment chassis is inserted horizontally into the equipment rack between the rails.

13. The apparatus of claim 12, wherein an end of the flange is bent such that the end is deflected away from the upper interior wall of the groove when the flange is deployed in the groove.

14. An apparatus, comprising:
    an equipment rack comprising an opposed pair of rails mounted horizontally therein;
    an equipment chassis housing electronic circuitry and positioned between the opposed pair of rails, the equipment chassis comprising a bottom face resting on shelf members of the rails; and
    a retaining bracket disposed at a side face of the equipment chassis facing one of the rails and oriented substantially perpendicular to the bottom face of the equipment chassis, the retaining bracket engaging a horizontal groove in the one of the rails to limit vertical movement of the equipment chassis.

15. The apparatus of claim 14, wherein the retaining bracket is fastened to the side face of the equipment chassis.

16. The apparatus of claim 14, wherein the retaining bracket comprises:
   a planar member conforming to the side face of the equipment chassis; and
   a flange extending perpendicularly from the planar member and engaging the groove.

17. The apparatus of claim 16, wherein an upper surface of the flange faces an upper interior wall of the groove.

18. The apparatus of claim 17, wherein an end of the flange is bent such that the end is deflected away from the upper interior wall of the groove.

19. The apparatus of claim 16, wherein the retaining bracket is disposed proximate a rear of the equipment chassis such that it is positioned proximate a first end of the one of the rails and wherein a front mounting flange of the equipment chassis is configured to be attached to a mounting flange of the one of the rails proximate a second end thereof.

20. The apparatus of claim 16, wherein the one of the rails comprises a flange positioned in the groove proximate the first end of the one of the rails and configured to engage an upper surface of the flange of the retaining bracket to further limit movement thereof in the groove when the equipment chassis is fully inserted into the equipment rack.

* * * * *